United States Patent
Wong et al.

(10) Patent No.: US 7,242,084 B2
(45) Date of Patent: Jul. 10, 2007

(54) APPARATUSES AND ASSOCIATED METHODS FOR IMPROVED SOLDER JOINT RELIABILITY

(75) Inventors: Chee Wai Wong, Kuala Lumpur (MY); Cheng Siew Tay, Tanjung Bungah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/139,223

(22) Filed: May 27, 2005

(65) Prior Publication Data

US 2006/0267217 A1 Nov. 30, 2006

(51) Int. Cl.
*H01L 23/48* (2006.01)

(52) U.S. Cl. .................. 257/693; 257/698; 257/E23.06

(58) Field of Classification Search ................ 257/697, 257/693
See application file for complete search history.

(56) References Cited

U.S. PATENT DOCUMENTS

| | | | | |
|---|---|---|---|---|
| 5,490,040 | A | * | 2/1996 | Gaudenzi et al. ........... 361/773 |
| 5,715,595 | A | * | 2/1998 | Kman et al. .................. 29/845 |
| 7,017,795 | B2 | * | 3/2006 | Liu et al. ................. 228/248.1 |
| 2001/0015491 | A1 | * | 8/2001 | Shiraishi ..................... 257/697 |
| 2001/0032388 | A1 | * | 10/2001 | Morris ......................... 29/852 |
| 2002/0016093 | A1 | * | 2/2002 | Nakamura ................. 439/76.2 |
| 2002/0081774 | A1 | * | 6/2002 | Liang et al. ................ 438/108 |
| 2003/0001254 | A1 | * | 1/2003 | Jackson et al. ............. 257/691 |

OTHER PUBLICATIONS

Cheng Siew Tay, et al., Behavior of Package With Integrated Heat Spreader, Pan Pacific Symposium, Feb. 10, 2004, Surface Mount Technology Association, Intel Products (Malaysia).

* cited by examiner

*Primary Examiner*—Sue A. Purvis
*Assistant Examiner*—Krista Soderholm
(74) *Attorney, Agent, or Firm*—Kathy J. Ortiz

(57) ABSTRACT

Apparatuses and associated methods to improve integrated circuit packaging are generally described. More specifically, apparatuses and associated methods to improve solder joint reliability are described. In this regard, according to one example embodiment, one or more strengthening pin(s) are coupled to the periphery of a package substrate, the strengthening pin(s) capable of coupling to a circuit board.

19 Claims, 5 Drawing Sheets

APPARATUSES AND ASSOCIATED METHODS FOR IMPROVED SOLDER JOINT RELIABILITY

TECHNICAL FIELD

Embodiments of the present invention are generally directed to integrated circuit packaging and, more particularly, to apparatuses and associated methods for improved solder joint reliability.

BACKGROUND

The solder joints of microelectronic packages most often fail at the package corners when placed under mechanical stresses such as shock, vibration, or drop tests. Such failures may compromise the reliability of microelectronic packages. Current methods to solve solder joint failure at the package corner include increasing the metal pad diameter opening, using bigger solder balls, increasing the solder joint standoff height, and imposing sacrificial balls at the package corner. However, these solutions are increasingly incompatible with packages that are shrinking in size to accommodate tighter ball pitch and increase Input/Output (IO) count. An innovative solution is, therefore, needed to address solder joint reliability as the market drives toward smaller package size.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Embodiments of apparatuses to improve solder joint reliability and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
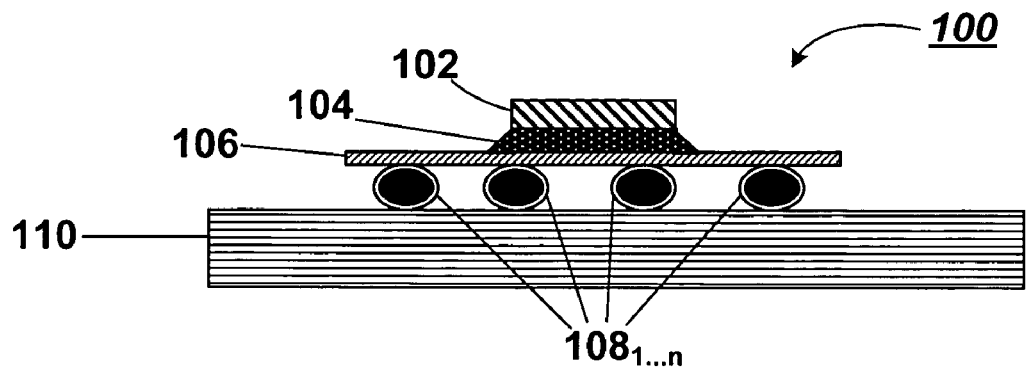
FIG. 1 is a cross-section side view of an example ball grid array package (prior art), according to but one example embodiment.

FIG. 1 provides a cross-section side view of an example Ball Grid Array (BGA) package 100 according to but one example embodiment of the current art. In accordance with the illustrated example, an example configuration for a BGA package 100 is presented comprising one or more of an integrated circuit (IC) die 102, an underfill 104, a package substrate 106, an array of solder balls $108_{1 \ldots n}$ (where n represents a variable number of repeating structures), and a circuit board 110, each coupled as shown.

Figure 2:
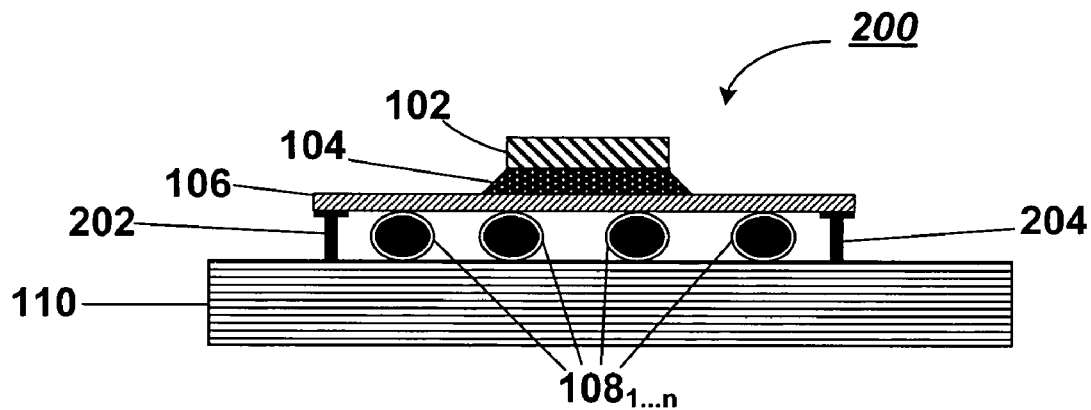
FIG. 2 is a cross-section side view of an example ball grid array package with one or more strengthening pin(s) coupled to each package substrate corner, according to but one example embodiment.

FIG. 2 provides a cross-section side view of an example BGA package 200 with one or more strengthening pin(s) 202, 204 coupled to each package substrate 106 corner, according to but one example embodiment. In one example configuration, BGA package 200 may include one or more of an IC die 102, an underfill 104, a package substrate 106, an array of solder balls $108_{1 \ldots n}$, a circuit board 110, and one or more strengthening pin(s) 202, 204, each coupled as shown.

In one embodiment, one or more strengthening pin(s) 202, 204 may be coupled to the periphery of a package substrate 106, the strengthening pin(s) 202, 204 capable of coupling to a circuit board. In another example embodiment, one or more strengthening pin(s) 202, 204 may be coupled to a circuit board, the strengthening pin(s) 202, 204 capable of coupling to the periphery of a package substrate 106.

In another example embodiment, one or more strengthening pin(s) 202, 204 may provide mechanical support to the solder joints between the package substrate 106, solder balls $108_{1 \ldots n}$, and circuit board 110. An advantage of the strengthening pin(s) 202, 204 is that they may enhance mechanical stability without requiring as much of the increasingly limited space on the package substrate 106 as other solutions. One or more strengthening pin(s) 202, 204 may be coupled anywhere near the periphery of the package substrate 106, including the corners, to provide mechanical support. A strengthening pin may be a dummy, redundant, unused, or non-functional pin to provide support to the package.

BGA package 200 depicts an exemplary Flip Chip Ball Grid Array (FCBGA) package; however, the package is not limited in this regard. Those skilled in the art will appreciate that a variety of other packages may be compatible with the solder joint reliability improvements posed is herein. For example, in another embodiment, one or more strengthening pin(s) may be coupled to the package substrate of a Flip Chip Molded Matrix Array (FCMMA) package.

Strengthening pin(s) 202, 204 may be constructed of any material suitable for providing support to a package substrate including, but not limited to, metals, polymers, and alloys 106. In one example embodiment, strengthening pin(s) 202, 204 may be gold-plated. In another example embodiment, strengthening pin(s) 202, 204 may be pre-coated with a solderable material.

Figure 3:
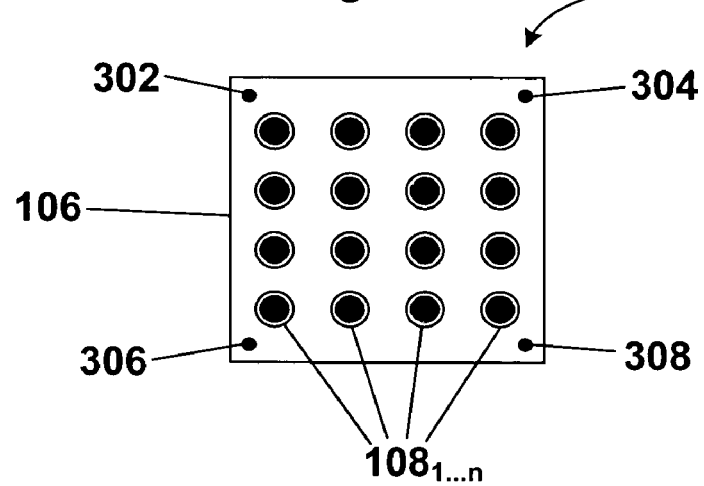
FIG. 3 is a cross-section bottom view of an example package substrate with a strengthening pin coupled to each package corner, according to but one example embodiment.

FIG. 3 provides a cross-section bottom view 300 of an example package substrate 106, an array of solder balls 108$_{1...n}$, and one or more strengthening pin(s) 302, 304, 306, 308 positioned near each package corner, according to but one example embodiment. Again, strengthening pin(s) 302, 304, 306, and 308 are illustratively depicted in each corner by way of example only and not by limitation. Though most solder joint reliability failures normally occur near the package corners, those skilled in the art will appreciate that one or more strengthening pin(s) can be suitably coupled anywhere near the periphery of the package substrate to provide mechanical support.

Figure 4:
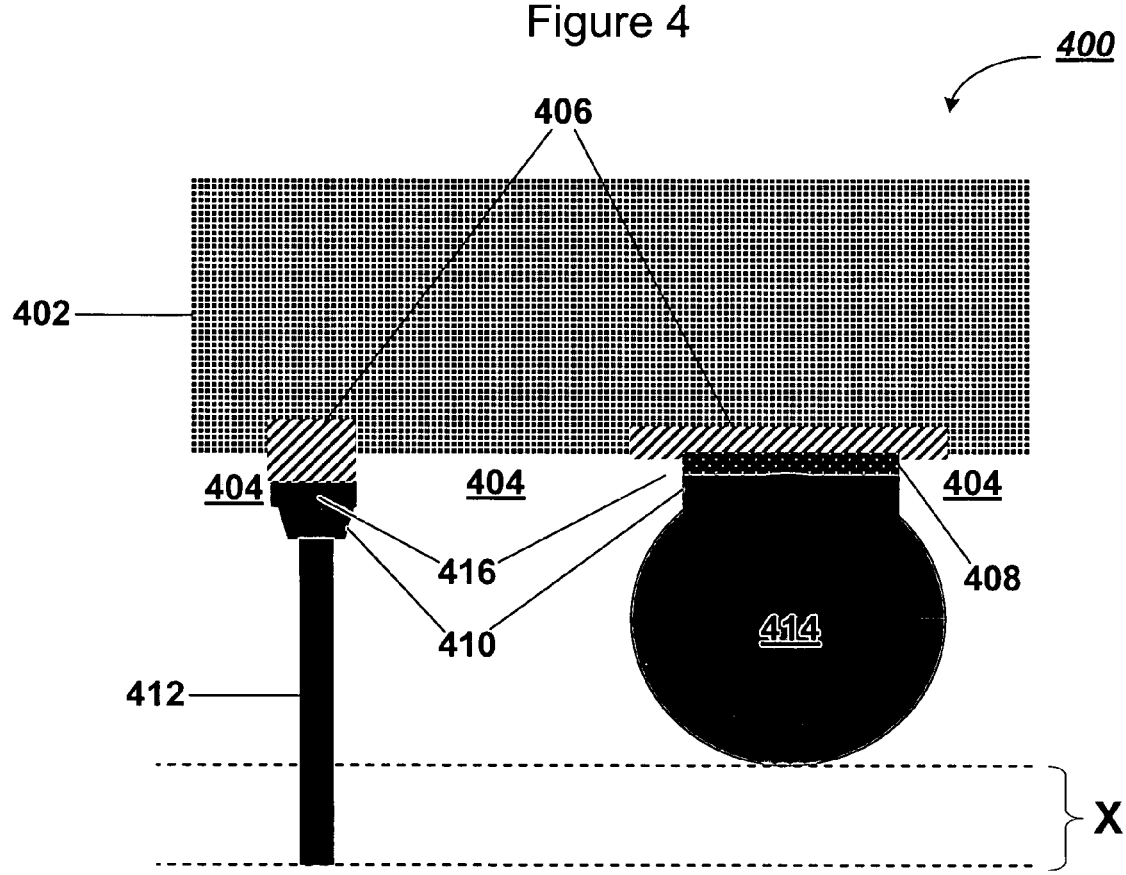
FIG. 4 is a cross-section exploded side view of an example strengthening pin coupled to a package substrate, according to but one example embodiment.

FIG. 4 provides a cross-section exploded side view 400 of an example strengthening pin 412 coupled to a package substrate 402, according to but one example embodiment. In one embodiment, an example configuration comprising a package substrate 402, solder mask 404, copper pads 406, nickel layer 408, solder joint 410, strengthening pin 412, and solder ball 414, may be coupled as shown. Other functionally similar materials may be used for pads 406 and layer 408.

In one example embodiment, one or more strengthening pin(s) 412 may be coupled to substrate 402 using a solder joint 410. In another embodiment, solder mask 404 may be an epoxy layer with one or more pad opening(s) 416 (region filled with solder joint 410 in FIG. 4), wherein copper pads 406 are used to couple example strengthening pin 412 and solder ball 414 to a substrate 402 using a solder joint 410. Solder, as referenced in this description, is any of various solderable materials, including fusible alloys such as lead or tin, to join parts.

Another embodiment provides that example strengthening pin 412 may extend beyond solder balls 414 attached to substrate 402 by a distance, X, sufficient to enable insertion and coupling of example pin 412 to a circuit board 110. Those skilled in the art will appreciate that X will depend on the circuit board design and the desired degree of mechanical support from the strengthening pin(s).

In one embodiment, one or more strengthening pin(s) 412 may be coupled to substrate 402 using a solder reflow process. Another embodiment provides inserting one or more strengthening pin(s) 412 into the pad openings 416 of the substrate 402 and applying a solder reflow process to form a joint 410 between the pin(s) 412 and the substrate 402. The one or more strengthening pin(s) 412 may be pre-coated with a layer of solderable material.

In an embodiment, the placement of the pin(s) 412 into an opening on the substrate 416 occurs after solder ball 414 placement. In another embodiment, a solder reflow process simultaneously attaches pin(s) 412 and solder balls 414 to the substrate 402. Though coupling strengthening pin(s) 412 and solder balls 414 to the substrate 402 simultaneously can complicate the ball attachment process, simultaneous attachment provides a benefit of eliminating an additional process step. Placement refers to placing the pin(s) 412 or ball(s) 414 onto the substrate and occurs before reflow. Attachment, in this regard, refers to forming a solder joint using, for example, a reflow process.

Figure 5:
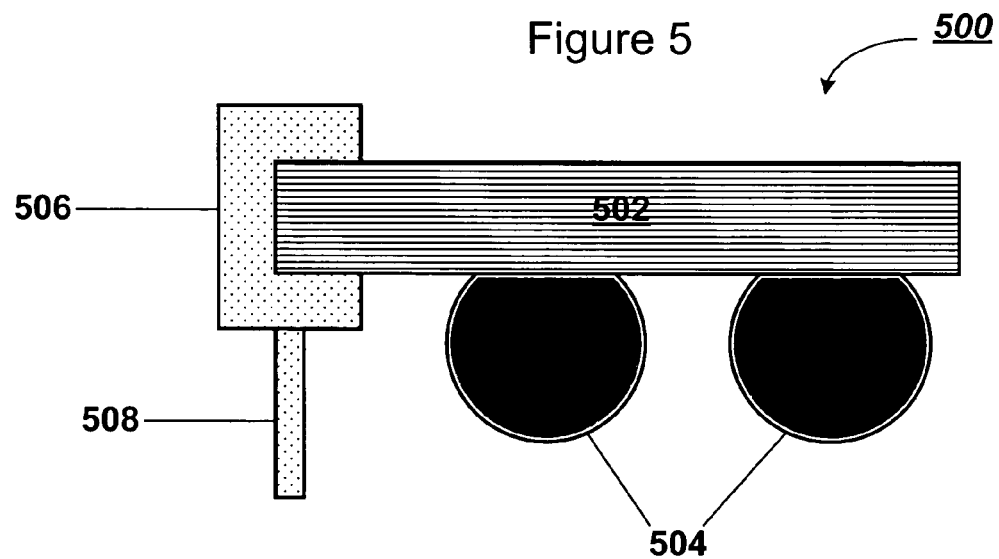
FIG. 5 is a cross-section exploded side view of an example strengthening pin with socket coupled to a package substrate, according to but one example embodiment.

FIG. 5 provides a cross-section exploded side view 500 of an example strengthening pin 508 with socket 506 coupled to a package substrate 502, according to but one example embodiment. In one example embodiment, a pin 508, a socket 506, a package substrate 502, and solder balls 504, may be coupled as shown.

Another embodiment provides one or more strengthening pin(s) 508 with socket(s) 506 on an end of the pin(s) such that the socket(s) 506 are designed to couple to the periphery of the package substrate as shown. Example strengthening pin 508 and socket 506 may be composed of the same element or composed of fused separate components. Those skilled in the art will recognize that a substrate edge 502 and socket 506 may be designed in various ways such that secure coupling is accomplished; such embodiments are envisioned.

In another embodiment, example strengthening pin 508 may extend beyond solder balls 504 attached to substrate 502 by a distance sufficient to enable insertion and coupling of example pin 508 to a circuit board 110.

One embodiment provides that pin 508 with socket 506 may be coupled to substrate 502 after completion of a solder ball 504 attachment process, including reflow. This embodiment provides a benefit of keeping the pin attachment process completely separate from the ball attachment process; coupling pin(s) 508 and solder ball(s) 504 to the substrate 502 simultaneously can complicate the ball attachment process.

FIGS. 6a–d provide cross-section side view snapshots 600 of an example method for coupling a strengthening pin 614 to a circuit board 604 using a blind via 602, according to but one example embodiment. Such embodiment is an exemplary solder reflow process used to couple one or more strengthening pin(s) to a circuit board.

Figure 6A:
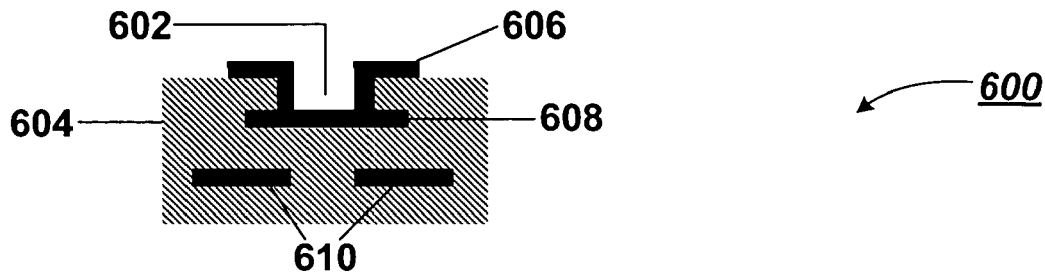
FIGS. 6a–d depict cross-section side view snapshots of an example method for coupling a strengthening pin to a circuit board using a blind via, according to but one example embodiment.
Figure 6B:
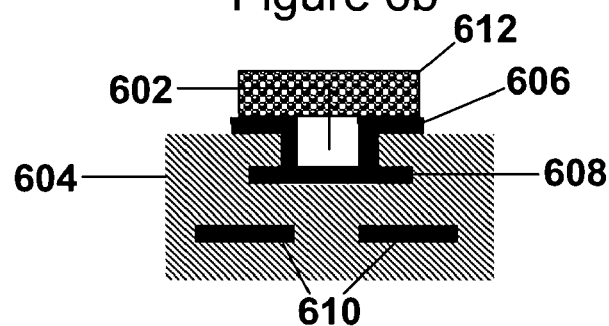
Figure 6C:
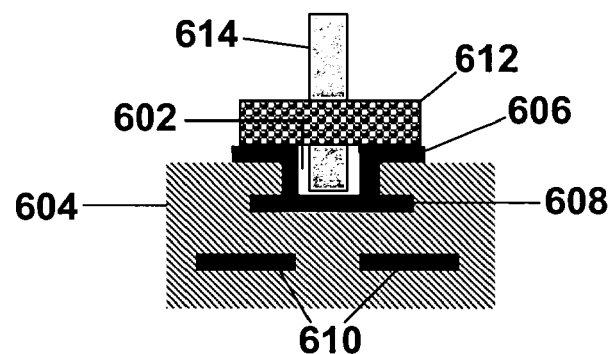
Figure 6D:
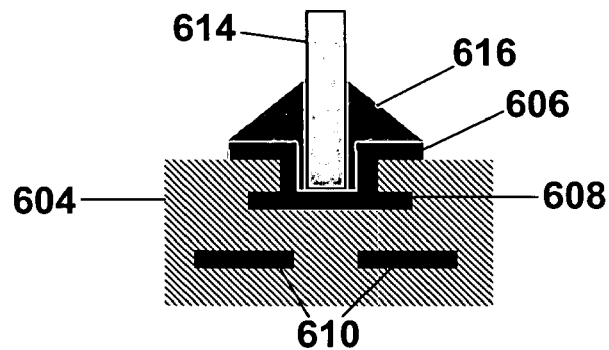

The configuration in FIG. 6a includes a circuit board 604, a blind via 602, copper plating 606, 608, and internal traces 610, each arranged as shown. FIG. 6b depicts placement of solder paste 612 over the opening of blind via 602. FIG. 6c depicts insertion of a strengthening pin 614 into blind via 602. FIG. 6d depicts a solder joint 616 formed between strengthening pin 614 and circuit board 604 after reflow.

In one embodiment, one or more strengthening pin(s) 614 may be coupled to a circuit board 604 by securing the strengthening pin(s) 614 into one or more blind via(s) 602 on the circuit board 604 using a solder reflow process to form a joint 616 between the pin(s) 614 and the circuit board 604.

FIGS. 7a–d provide cross-section side view snapshots 700 of an example method for coupling a strengthening pin 710 to a circuit board 704 using a through-hole via 702, according to but one example embodiment.

Figure 7A:
FIGS. 7a–d depict cross-section side view snapshots of an example method for coupling a strengthening pin to a circuit board using a through-hole via, according to but one example embodiment.
Figure 7B:
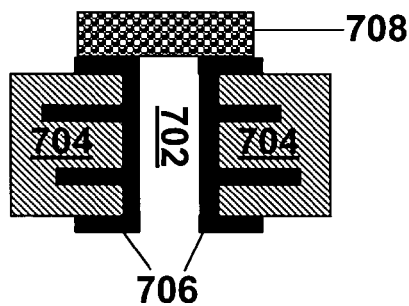
Figure 7C:
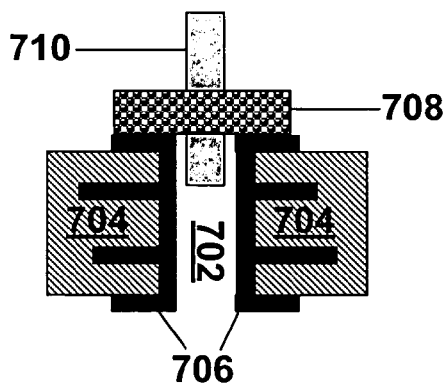
Figure 7D:
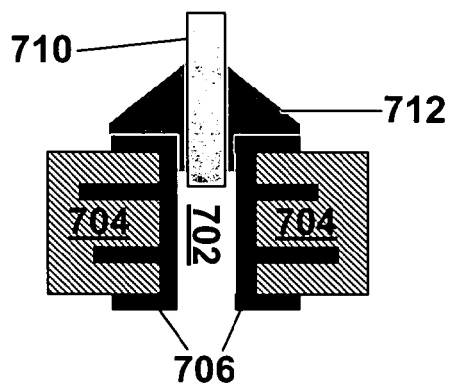

The configuration in FIG. 7a includes a circuit board 704, a through-hole via 702, and copper plating 706, each arranged as shown. FIG. 7b depicts placement of solder paste 708 over the opening of through-hole via 702. FIG. 7c depicts insertion of a strengthening pin 710 into through-hole via 702. FIG. 7d depicts a solder joint 712 formed between strengthening pin 710 and circuit board 704 after reflow.

In one embodiment, one or more strengthening pin(s) 710 may be coupled to a circuit board 704 by securing the strengthening pin(s) 710 into one or more through-hole via(s) 702 on the circuit board 704 using a solder reflow process to form a joint 712 between the pin(s) 710 and the circuit board 704. In alternative embodiments, one or more strengthening pin(s) 614, 710 may be coupled to a circuit board using any suitable fastening technique.

In another embodiment, one or more strengthening pin(s) 614, 710 may be coupled to a circuit board 604, 704 by providing one or more via(s) 602, 702 on a circuit board 604, 704, placing solder paste 612, 708 over the opening of one or more via(s) 602, 702, inserting one or more pin(s) 614, 710 through the solder paste 612, 708 into the one or more via(s) 602, 702, and reflowing the solder paste 612, 708 to form a solder joint 616, 712 between the one or more pin(s) 614, 710 and the circuit board 604, 704.

Figure 8:
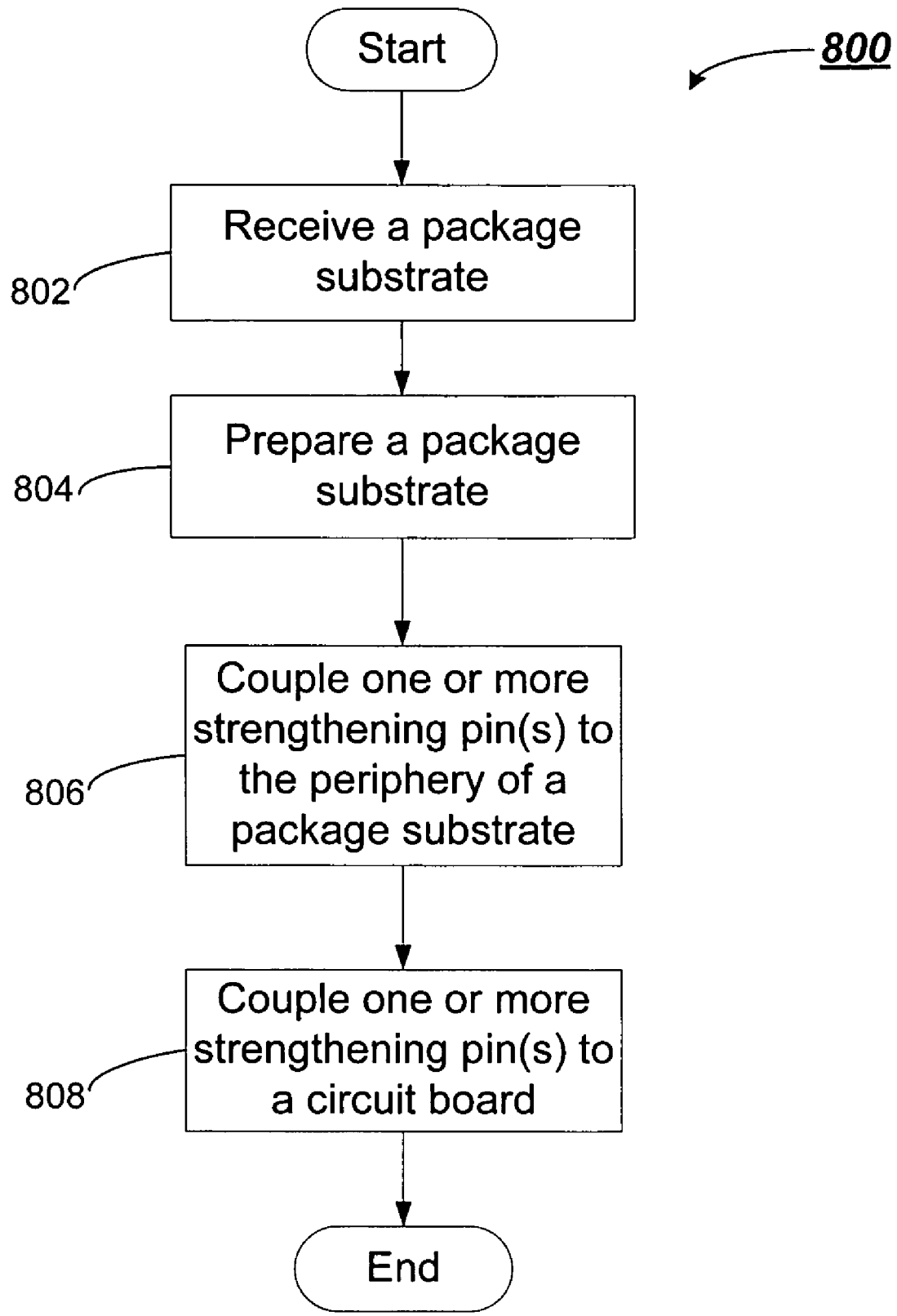
FIG. 8 is a flow chart of an example method to couple one or more strengthening pin(s) to a substrate package and a circuit board according to but one example embodiment.

FIG. 8 provides a flow chart 800 of an example method to couple one or more strengthening pin(s) 412, 508 to a substrate package 402, 502 and a circuit board 604, 704 according to but one example embodiment. In accordance with flowchart 800, one example method includes receiving a package substrate 802, preparing a package substrate 804, coupling one or more strengthening pin(s) to the periphery of a package substrate 806, and coupling one or more strengthening pin(s) to a circuit board 808.

In an embodiment of flow chart 800, a package substrate 402, 502 may be received by process equipment. Preparing a package substrate may include a ball-placement process where substrate 402 may be printed with flux and solder balls 414 are placed on the substrate 402. Then, one or more strengthening pin(s) 412 may be coupled to the periphery of the substrate 402. In one example embodiment, the pin(s) 412, pre-coated with solderable material, may be placed into openings 416 in the substrate 402 and a reflow process may be applied to the substrate 402 to simultaneously form joints 410 between the substrate 402 and the pin(s) 412 and between the substrate 402 and the solder ball(s) 404.

In an alternate embodiment, a package substrate 402, 502 may be received by process equipment. Preparing a package substrate 502 may include subjecting a substrate to a ball-attachment process and reflow process to form joints between the solder balls 504 and substrate 502. Subsequently, one or more strengthening pin(s) 508 may be coupled to the periphery of a package substrate 502.

Though flowchart 800 depicts that the processes are attached with unidirectional arrows, this is solely for ease of illustration purposes and does not necessarily limit or imply the ordering of the processes. The process events may occur out of sequence or not at all. For example, coupling one or more strengthening pin(s) to a circuit board may occur before coupling the one or more strengthening pin(s) to a package substrate in one embodiment. In an alternative example, a method may comprise receiving a package substrate, preparing a package substrate, and coupling one or more strengthening pin(s) to the periphery of a package substrate, without necessarily coupling the one or more strengthening pin(s) to a circuit board.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus comprising:
   a package substrate; and
   one or more strengthening pin(s) coupled to the periphery of the package substrate, wherein the one or more strengthening pin(s) are coupled to the substrate using a socket on an end of the pin(s) to secure the pins to the substrate by affixing the socket to an edge of the substrate, and wherein a portion of the socket is located exterior to the edge of the substrate, wherein the strengthening pin(s) is capable of coupling to a circuit board.

2. An apparatus according to claim 1, wherein the one or more strengthening pin(s) are coupled to a circuit board.

3. An apparatus according to claim 1, wherein the one or more strengthening pin(s) protrude beyond any solder balls attached to the package substrate by a distance sufficient to enable coupling of the pin(s) to a circuit board.

4. An apparatus according to claim 1, wherein the one or more strengthening pin(s) are coupled to each corner of the package substrate.

5. An apparatus according to claim 2, wherein the one or more strengthening pin(s) are coupled to a circuit board by securing the strengthening pin(s) into one or more blind via(s) on the circuit board using a solder reflow process.

6. An apparatus according to claim 2, wherein the one or more strengthening pin(s) are coupled to a circuit board by securing the strengthening pin(s) into one or more through-hole via(s) on the circuit board using a solder reflow process.

7. A method comprising:
   receiving a package substrate;
   preparing the package substrate; and
   coupling one or more strengthening pin(s) to the periphery of the package substrate by providing a socket on an end of the one or more pin(s) and securing the socket to an edge of the package substrate, wherein a portion of the socket is located exterior to the edge of the substrate.

8. A method according to claim 7, further comprising:
   coupling the one or more strengthening pin(s) to a circuit board.

9. A method according to claim 7, wherein securing the socket to an edge of the package substrate occurs after a solder ball reflow process.

10. A method according to claim 7, wherein coupling one or more strengthening pin(s) to the periphery of the package substrate includes providing pin(s) to protrude beyond the solder balls by a distance sufficient to enable insertion of the pin(s) into a circuit board.

11. A method according to claim 8, wherein coupling the one or more strengthening pin(s) to a circuit board comprises:
   providing one or more via(s) on a circuit board;
   placing solder paste over an opening of one or more via(s);
   inserting one or more strengthening pin(s) through the solder paste into one or more via(s); and
   reflowing the solder paste to form a solder joint between the one or more strengthening pin(s) and the circuit board.

12. A method according to claim 11, wherein providing one or more via(s) includes providing one or more blind via(s).

13. A method according to claim 11, wherein providing one or more via(s) includes providing one or more through-hole via(s).

14. A system comprising:
   a circuit board;
   a package substrate; and
   one or more strengthening pin(s) coupled to the periphery of the package substrate, wherein the one or more strengthening pin(s) are coupled to the package substrate using a socket on an end of the pin(s) to secure the pins to the substrate by affixing the socket to an edge of the substrate, and wherein a portion of the socket is located exterior to the edge of the substrate, wherein the strengthening pin(s) is capable of coupling to a circuit board.

15. A system according to claim 14, wherein the one or more strengthening pin(s) are coupled to the circuit board by securing the strengthening pin(s) into one or more blind via(s) on the circuit board using a solder reflow process.

16. A system according to claim 14, wherein the one or more strengthening pin(s) are coupled to the circuit board by securing the strengthening pin(s) into one or more through-hole via(s) on the circuit board using a solder reflow process.

17. A system according to claim 14, wherein the one or more strengthening pin(s) are coupled to each corner of the package substrate.

18. A system according to claim 14, wherein the one or more strengthening pin(s) protrude beyond any solder balls attached to the package substrate by a distance sufficient to enable insertion of the pin(s) into the circuit board.

19. The system of claim 14 further comprising:
another device electrically coupled to the circuit board.

* * * * *